(12) United States Patent
Clidaras et al.

(10) Patent No.: US 8,853,872 B2
(45) Date of Patent: Oct. 7, 2014

(54) WATER-BASED DATA CENTER

(75) Inventors: Jimmy Clidaras, Los Altos, CA (US); David W. Stiver, Santa Clara, CA (US)

(73) Assignee: Google Inc., Mountain View, CA (US)

( * ) Notice: Subject to any disclaimer, the term of this patent is extended or adjusted under 35 U.S.C. 154(b) by 619 days.

(21) Appl. No.: 12/431,639

(22) Filed: Apr. 28, 2009

(65) Prior Publication Data

US 2009/0295167 A1 Dec. 3, 2009

Related U.S. Application Data

(63) Continuation-in-part of application No. 11/679,013, filed on Feb. 26, 2007, now Pat. No. 7,525,207.

(51) Int. Cl.
*F25D 23/12* (2006.01)

(52) U.S. Cl.
USPC .......................................... 290/43; 62/259.2

(58) Field of Classification Search
USPC ............................................. 290/53; 165/45
See application file for complete search history.

(56) References Cited

U.S. PATENT DOCUMENTS

| | | | | |
|---|---|---|---|---|
| 4,254,818 A | * | 3/1981 | Melamed | ......................... 165/45 |
| 4,781,023 A | | 11/1988 | Gordon | |
| 5,189,978 A | * | 3/1993 | McAllister | ..................... 114/258 |
| 5,975,192 A | * | 11/1999 | Moratalla et al. | ................ 165/45 |
| 6,020,653 A | | 2/2000 | Woodbridge et al. | |
| 6,100,600 A | * | 8/2000 | Pflanz | ............................. 290/54 |
| 6,450,247 B1 | * | 9/2002 | Raff | ................................ 165/45 |
| 6,559,552 B1 | | 5/2003 | Ha | |
| 6,681,584 B1 | * | 1/2004 | Conner | ............................ 62/171 |
| 6,813,897 B1 | | 11/2004 | Bash et al. | |
| 6,833,631 B2 | | 12/2004 | Van Breems | |
| 6,904,967 B2 | * | 6/2005 | McLaughlin | .................. 165/201 |
| 6,953,328 B2 | | 10/2005 | Welch, Jr. et al. | |
| 7,059,123 B2 | | 6/2006 | Welch, Jr. et al. | |
| 7,088,585 B2 | * | 8/2006 | Chu et al. | ........................ 361/699 |
| 7,105,939 B2 | | 9/2006 | Bednyak | |
| 7,118,307 B2 | * | 10/2006 | Stoecker et al. | ................. 405/50 |
| 7,120,021 B2 | * | 10/2006 | Hamman | ........................ 361/699 |
| 7,218,523 B2 | * | 5/2007 | Hamman | ........................ 361/718 |
| 7,257,946 B2 | | 8/2007 | Welch, Jr. | |
| 7,258,532 B2 | | 8/2007 | Welch, Jr. et al. | |

(Continued)

FOREIGN PATENT DOCUMENTS

| | | | | |
|---|---|---|---|---|
| JP | 2002374086 A | * | 12/2002 | ............... H05K 7/20 |
| JP | 2008215680 | | 9/2008 | |

(Continued)

OTHER PUBLICATIONS

Invitation to Pay Additional Fees (3 pages); Partial International Search Report (5 pages), mailed Aug. 11, 2010, for related international application PCT/US2010/032782.

(Continued)

*Primary Examiner* — Joseph Waks
(74) *Attorney, Agent, or Firm* — Fish & Richardson P.C.

(57) ABSTRACT

A system includes a cooling water intake conduit having a water intake in a submerged area of an open natural body of water, a first water-to-water heat exchanger having a first side in fluid communication with the cooling water intake conduit, and a closed water loop in fluid communication with a second side of the water-to-water heat exchanger and arranged to route water to cooling structures at a computer data center.

22 Claims, 8 Drawing Sheets

(56) References Cited

U.S. PATENT DOCUMENTS

| | | | |
|---|---|---|---|
| 7,269,751 B2 | 9/2007 | Janakiraman et al. | |
| 7,278,273 B1 | 10/2007 | Whitted et al. | |
| 7,298,056 B2 | 11/2007 | Gizara | |
| 7,331,174 B2 | 2/2008 | Welch, Jr. et al. | |
| 7,453,165 B2 | 11/2008 | Hench | |
| 7,508,672 B2* | 3/2009 | Hamman | 361/701 |
| 7,525,207 B2 | 4/2009 | Clidaras et al. | |
| 7,560,831 B2* | 7/2009 | Whitted et al. | 307/64 |
| 7,897,019 B2* | 3/2011 | Akers | 203/10 |
| 8,209,993 B2* | 7/2012 | Carlson et al. | 62/259.2 |
| 8,554,390 B2* | 10/2013 | Canney et al. | 700/300 |
| 2004/0206681 A1* | 10/2004 | Gordon | 210/259 |
| 2005/0052848 A1* | 3/2005 | Hamman | 361/701 |
| 2005/0063782 A1* | 3/2005 | Stoecker et al. | 405/50 |
| 2005/0083656 A1* | 4/2005 | Hamman | 361/699 |
| 2005/0225936 A1* | 10/2005 | Day | 361/687 |
| 2006/0097578 A1* | 5/2006 | Baldwin et al. | 307/66 |
| 2007/0281639 A1 | 12/2007 | Clidaras et al. | |
| 2008/0011681 A1* | 1/2008 | Gordon | 210/650 |
| 2008/0029250 A1 | 2/2008 | Carlson et al. | |
| 2008/0055846 A1 | 3/2008 | Clidaras et al. | |
| 2008/0055848 A1 | 3/2008 | Hamburgen et al. | |
| 2008/0055850 A1 | 3/2008 | Carlson et al. | |
| 2008/0086652 A1* | 4/2008 | Krieger et al. | 713/330 |
| 2008/0115515 A1* | 5/2008 | Bailey et al. | 62/181 |
| 2008/0115523 A1* | 5/2008 | Bailey et al. | 62/401 |
| 2008/0209234 A1 | 8/2008 | Clidaras et al. | |
| 2009/0078401 A1* | 3/2009 | Cichanowicz | 165/299 |
| 2009/0168345 A1* | 7/2009 | Martini | 361/691 |
| 2009/0206670 A1* | 8/2009 | Whitted et al. | 307/64 |
| 2010/0057263 A1* | 3/2010 | Tutunoglu | 700/282 |
| 2010/0078160 A1* | 4/2010 | Novotny et al. | 165/247 |
| 2012/0123607 A1* | 5/2012 | Canney et al. | 700/300 |

FOREIGN PATENT DOCUMENTS

| | | |
|---|---|---|
| WO | 2006/135239 | 12/2006 |
| WO | WO 2007/139558 | 12/2007 |
| WO | WO 2007/139560 | 12/2007 |
| WO | 2008/151888 | 12/2008 |

OTHER PUBLICATIONS

R.H. Katz, "Tech Titans Building Boom" IEEE Spectrum, vol. 46, No. 2, Feb. 1, 2009, pp. 40-54.

Notification of Transmittal of the International Search Report and the Written Opinion of the International Searching Authority, or Declaration (3 pages); International Search Report (7 pages); and Written Opinion of the International Searching Authority (13 pages), mailed Oct. 18, 2010, for related international application PCT/US2010/032782.

Authorized Officer Nora Lindner, International Preliminary Report on Patentability for Application No. PCT/US2010/032782, mailed Nov. 10, 2011, 13 pages.

Cringley, Robert, "Google-Mart: Sam Walton Taught Google More About How to Dominate the Internet Than Microsoft Ever Did," I, Cringely—The Pulpit, Nov. 17, 2005, 3 pages.

Pelamis Wave Power, "P-750 Wave Energy Converter," Sep. 2007, 8 pages.

Rackable Systems, "Rackable Systems Contcentro Modular Data Center high Density, High Efficiency Mobile Computing," Datasheet, 2007, 1 page.

Renewable Energy World, "Pelamis Waqve Energy Converter is Launched," available at http://www.renewableenergyworld.com/rea/news/story?id=10639, Retrieved Mar. 3, 2004, 4 pages.

Shankland, Stephen, "Sun Blackbox, meet APC's whitebox," cNet News.com, available at httn://news.com.com/Sun+Blackbox%2C+meet+APCs+whitebox/2001-1010 3-617774.html, Jan. 7, 2007, 2 pages.

SRP, "Wave Energy Project Based on Prelamis Technology in New Caledonia," Oct. 24, 2007, 8 pages.

Sun Project Blackbox-Index, Available at: http://www.sun.com/emrkt/blackbox/index.jsp, Retrieved Oct. 19, 2006, 3 pages.

Sun Project Blackbox-Scenarios, Available at:http://www.sun.com/emrk/blackbox/senarios.jsp, Retrieved Oct. 19, 2006, 7 pages.

Wikipedia, "Pelamis Wave Energy Converter," available at http://en.wikipedia.org/wiki/Pelamis_Wave_Energy_Converter, Retrieved Dec. 12, 2008, 3 pages.

* cited by examiner

WATER-BASED DATA CENTER

RELATED ART

This application is a continuation-in-part under 35 U.S.C. §120, which claims priority to U.S. application Ser. No. 11/679,013, filed Feb. 26, 2007, now U.S. Pat. No. 7,525,207. The disclosure of the prior application is considered part of (and are incorporated by reference in) the disclosure of this application.

TECHNICAL FIELD

This document discusses water-based data centers, including systems that may be powered by the motion of water.

BACKGROUND

Public use of the internet continues to grow, with millions of people now accessing the global network. The bandwidth demanded by each of those users also continues to grow substantially-moving from simple e-mails, to graphical web pages, to full streaming video at very high resolutions. In addition, with so-called Web 2.0 applications, more data is needed to support traditional computing applications over the internet. As a result, many information providers are building large computing facilities, known as data centers, that can provide various services to internet users. Sometimes, these data centers can contain thousands of networked computers mounted in a large number of racks.

The internet backbone also needs to grow to support the additional demand from all these new users and new services. Such growth is expensive, however, because backbone routers are huge, complex machines, and running of cross-country fibers costs very much money. In addition, cross-country communication can introduce latency to communications—both because of increased distances, and because of the increased chance of losing and retransmitting packets that are sent through many routers and through long distances.

Thus, it can be beneficial to distribute computing power closer to users. As such, data centers may be moved closer to users, with relevant content sent from a central facility out to regional data centers only once, and further transmissions occurring over shorter regional links. As a result, every request from a user need not result in a transmission cross-country and through the internet backbone—network activity may be more evenly balanced and confined to local areas. Also, transient needs for computing power may arise in a particular area. For example, a military presence may be needed in an area, a natural disaster may bring a need for computing or telecommunication presence in an area until the natural infrastructure can be repaired or rebuilt, and certain events may draw thousands of people who may put a load on the local computing infrastructure. Often, such transient events occur near water, such as a river or an ocean. However, it can be expensive to build and locate data centers, and it is not always easy to find access to necessary (and inexpensive) electrical power, high-bandwidth data connections, and cooling water for such data centers.

SUMMARY

This document describes systems and methods that may be employed to provide data center (e.g., computing, telecommunications, or other similar services) support in an area quickly and flexibly. In general, computing centers are located on a ship or ships, which are then anchored in a water body from which energy from natural motion of the water may be captured, and turned into electricity and/or pumping power for cooling pumps to carry heat away from computers in the data center. In particular examples, the water-powered devices for generating electricity are depicted as so-called Pelamis machines. The data centers may also be on shore and receive power and/or cooling water from floating systems.

In one implementation, a system is disclosed that comprises a floating platform-mounted computer data center comprising a plurality of computing units, a sea-powered electrical generator in electrical connection with the plurality of computing units, and one or more sea-water cooling units for providing cooling to the plurality of computing units. The computing units may be mounted in a plurality of crane-removable modules. The sea-powered electrical generator may comprise a wave-powered generator system, and may further include a plurality of motion-powered machines arranged in a grid and wired together. The wave-powered electrical generator system may likewise comprise one or more Pelamis machines.

In some aspects, the sea-powered electrical generator may comprise a tide-powered generator system. Also, the cooling units of the system may comprise a plurality of sea-powered pumps and one or more seawater-to-freshwater heat exchangers. In addition, the sea-water cooling units may comprise one or more water-to-water heat exchangers. Moreover, the system may further comprise one or more rectifiers for producing direct current supply power from power supplied by the electrical generator, and the rectifiers may provide power directly to components in the plurality of computing units without further AC-to-DC or DC-to-AC conversion. A plurality of step-down transformers may also be provided to convert the direct current power to a voltage usable by the components in the plurality of computing units.

In another implementation, a method of maintaining a computer data center is disclosed, and comprises generating electrical power using the wave, tidal, or current motion of water adjacent a data center, providing the generated electrical power to the data center, and circulating the water adjacent the data center through a heat exchanger to produce cooling for the data center equipment. The electrical power may be generated by the force of a floating device against moving waves. Also, the data center equipment may comprise a large plurality of computer boards mounted in rack arrays.

In yet another implementation, a system for maintaining a computer data center is disclosed. The system includes a data center located on or near an ocean or ocean extension, a cooling system for providing cooling to the data center using seawater, and a means for providing electrical power for use by the data center.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1A:
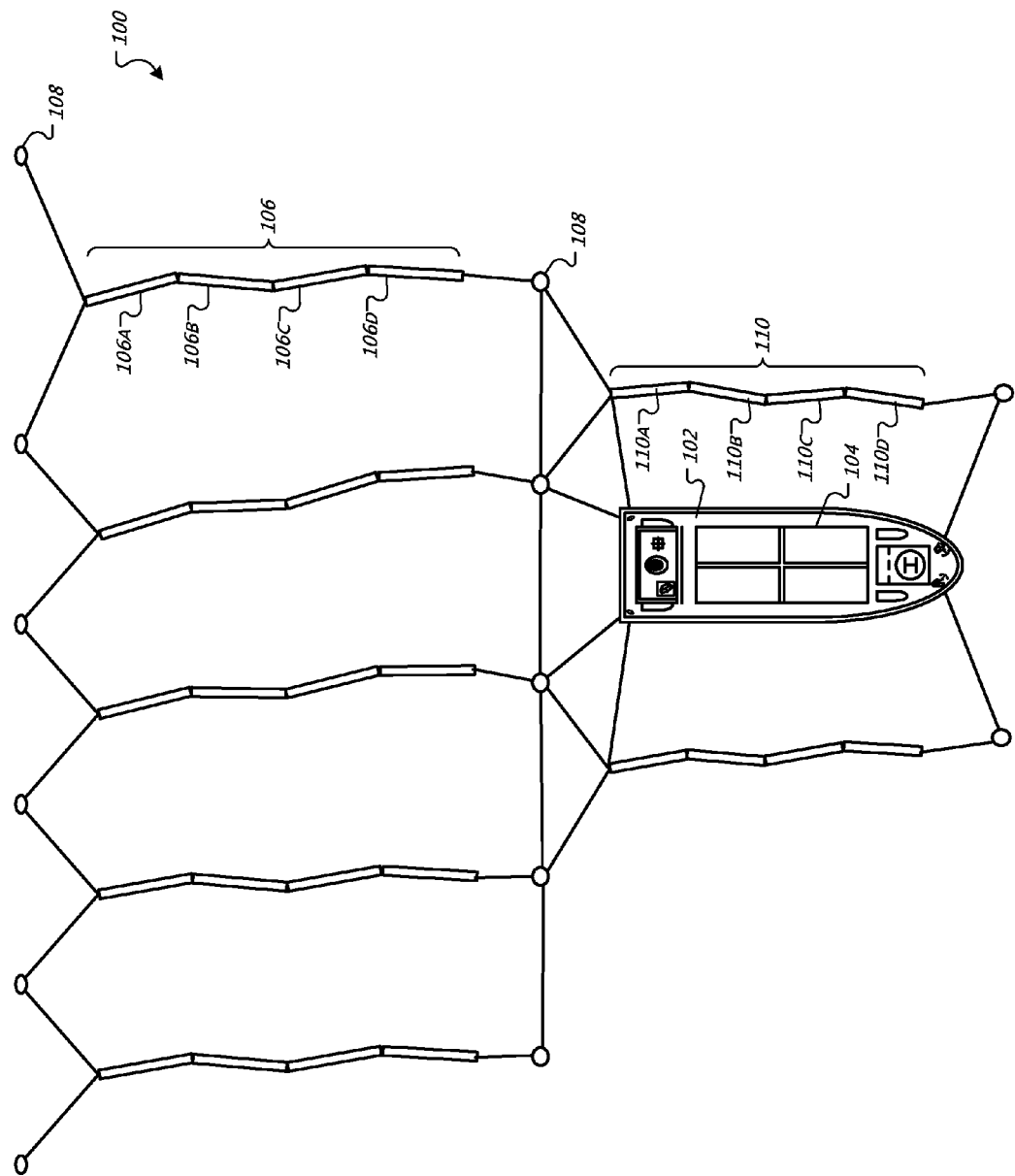
FIG. 1a is a top view of a floating data center system using an array of motion-powered machines.

FIG. 1A shows a top view of a floating data center system 100 using wave-power. In general, the system 100 has a floating platform and an array of wave-powered generators. The wave-powered generators 106, 110 may be implemented, for example, in the form of Pelamis machines, as discussed in more detail below. The floating platform 102 carries one or more modules of a modular data center 104, which may be powered from electricity produced by the motion of the wave-powered generators 106, and may be cooled by cooling water pumped by the wave-powered generators 110. As a result, the data center modules may operate without being connected to external utilities.

Such an arrangement may beneficially permit for more ready deployment of data centers to areas in particular need of computing or telecommunications power. The data centers may be quickly and inexpensively constructed on land, such as in modular units, including standard shipping containers. They may then be hauled, as shipping containers, on trucks to the seaside, and may then be lifted in conventional manner onto a ship. Once on the ship, they may be connected to electrical and cooling services already on the ship, and the ship may deploy to an area in need of assistance. The ship may then anchor in an area offshore where wave or tidal motion is sufficiently strong or large so as to permit electrical generation and pumping power. In addition, old modules may be easily replaced with newer modules, as new technologies develop or as old units quickly wear out under adverse sea conditions. Moreover, by using standard shipping containers whose transportation is well known to most dock workers and seamen, the system 100 may be more readily transported and implemented without significant or specialized training.

A floating platform 102, such as a cargo ship, may carry one or more modular data centers 104. For example, a freighter may have a data center contained in inter-modal freight containers. Existing mechanisms, such as port facilities, may be used to handle the containers. The platform 102 provides power and cooling capacity to the modular data centers 104, in addition to supporting the modular data centers 104. The modular data centers 104 may be arranged in a two-dimensional or three-dimensional grid. For example, as shown in the figure, two rows that each contain two containers are shown. Those modules could also be stacked two or more high, so that the platform 102 holds eight or twelve or more modules.

Support systems may be provided in the floating platform 102, such as for power and cooling of the modular data centers 104. For example, diesel powered electrical generators may be provided below decks to supply supplemental electrical power such as when high data loads are seen or when the motion-powered machines 106, 110 are otherwise not providing sufficient electricity. Also, pumps and other mechanical components may be provided upon the floating platform 102, and connections between the components and the modular data centers 104 may be provided. The connections may include connectors that terminate on the platform deck near where the data centers 104 are to be located, so that quick-connect connections may be made when the data centers 104 are dropped into location.

Motion-powered machines 106, 110 may provide power and cooling capacity for the platform 102. Motion-powered machines 106, 110 can harness wave energy from a body of water such as the sea or a river, and convert it to a useful form, such as a mechanical motion for powering an electrical generator or for turning or otherwise operating a water pump. One advantage of such a system is that the energy collected from the water is essentially free and non-polluting.

As shown in FIG. 1A, the motion-powered machines 106, 110 are arrayed into two groups, and are formed of multiple Pelamis machines that are described below. Machines 106 are an array of machines for electrical generation, and are tethered and electrically wired to platform 102. Machines 110 are a pair of machines for pumping of water that is around the platform 102 onto the platform. For example, machines 106 may each create a pumping action that pulls water from their immediate vicinity and pumps it onto the platform 102 through an appropriate conduit.

In general, motion-powered machines 106, 110 may be made up of multiple pontoon segments 106A-D, that are movable relative to each other. One exemplary system is the Pelamis P-750 Wave Energy Converter. The pontoons may take any appropriate size, but may each be on the order of 3.5 meters in diameter and 150 meters long. Each machine can generate approximately 750 kilowatts, and an array, or farm, of machines can produce 2.25 megawatts or more. Approximately 40 machines spread over a square kilometer could also produce approximately 30 MW. The system 100 may operate satisfactorily, for example, approximately 3-7 miles from shore, in 50-70 meters of water.

The pontoons 106A-D are connected end-to-end in a manner (e.g., using joints) that allows them to pivot relative to each other, such as with hinges that allow the motion-powered machines 106, 110 to flex at the pontoon joints. Each individual segment of a machine 106, 110 is connected to the next-adjacent segment with hydraulic cylinders next to the hinges or pivots. For example, each hydraulic piston may be connected to a first pontoon 106A and a second pontoon 106B.

As one pontoon segment pivots relative to another, a hydraulic piston or ram may move into one of the segments to force high pressure oil through hydraulic motors in the segment. The force of the rams may be evened out using hydraulic accumulators attached to the motors, which may operate at, for example, 1500 rpm. The hydraulic motors may in turn be connected via a drive shaft with one or more sealed electrical generators. In sum, relative pivoting of the segments causes the ram to force fluid through the motors, and in turn causes the electrical generators to turn and make electricity. Alternatively, the machines 106, 110 may power water pumps in a similar manner.

The motion-powered machines 106, 110 may be held in place by mooring lines attached to anchors 108. As waves encounter the pontoons, the pontoons may move up or down, bending at the joints to remain at the surface of the waves. Electricity produced by the generators on motion-powered machines 106, 110 may be passed via a conductor, such as a cable, to the floating platform 102.

Electrical power received from the motion-powered machines 106, 110 may be converted to an appropriate form for powering datacenters on the ship. For example, the power may be rectified to produce DC power that may be used directly by computers in modular data centers 104. The generated voltage may also be transformed to one or more appropriate levels. Other portions of the power may be transformed into an AC waveform of appropriate frequency to operate other items on floating platform 102 that require AC power.

The simple conversion to DC power, without subsequent rebuilding of the power into an AC signal (and subsequently bringing it back to a DC signal at each computer or rack in modular data centers 104) may provide for energy efficiency benefits. Each conversion introduces losses, and because the power can be used in DC form, there is no need to convert and re-convert the signal. Although the varying frequency of the AC signal generally coming from motion-powered machines 106, 110 generally requires rectification and rebuilding of a constant AC signal, because commercial and domestic users of the electricity demand an AC signal and because transmission over long distances is difficult using DC current, the described single conversion does not require particular AC current, and also does not require transmission over such a distance. Such an approach of converting AC power generated at a non-standard frequency to DC without further changes could be used for other natural sources having a changing frequency, such as wind generators on wind farms.

Electricity generated by the motion-powered machines 106 travels through electrical cables (not shown) connected to the platform 102. The electrical cables may run along mooring lines that tie the various motion-powered machines 106 back to the floating platform 102. Alternatively, the electrical cables may run separately from the mooring lines.

The motion-powered machines 106, 110 may be arranged in multiple configurations. Some configuration may be well-suited for maximizing efficiency, while other configurations may be well-suited for survivability, navigation, maintenance, or other purposes. Configurations may trade off several factors, including survivability, efficiency, deployment time, materials required, etc. In FIG. 1A, motion-powered machines 106, 110 are arranged parallel to the heading of the ship and to each other. A standard size for such a system may cover an area approximately 600 m×200 m. Each motion-powered machine may have a pontoon diameter of 3.5 m and length of 35 m. Additional pontoons may be added that increase the overall length of the motion-powered machine.

Some configurations of motion-powered machines may be best suited for efficiently collecting as much energy as possible. For instance, larger arrays may collect more energy than smaller arrays, and larger arrays may be useful where wave activity is not as vigorous as in other locations. Some configurations of motion-powered machines may be well-suited to conditions involving a prevailing weather pattern. For example, motion-powered machines may be oriented so that they are at a particular angle to surface trade winds and may harness energy from the waves driven by the trade winds.

Some configurations of motion-powered machines may be best suited to areas with waves that come from many directions. For instance, locations without prevailing winds may have motion-powered machines deployed in a manner that allows them to automatically orient themselves perpendicular to whichever waves are present. In such cases, the motion-powered machines may orient themselves automatically by being tethered at only one end so that the waves pull the motion-powered machine to the most efficient orientation.

Some configurations of motion-powered machines may utilize a layout that maximizes usage of a given space. For example, the motion-powered machines may be laid out in a grid with their anchored points making a honeycomb-shape that allows unhindered operation of all the motion-powered machines with any orientation while at the same time minimizing unused space.

Some configurations of motion-powered machines may be used to minimize required materials. For example, configurations may be used which variously minimize the use of cabling, piping, tethers, anchor points or other equipment. Such configurations may minimize the number of anchor points and tether points that are needed. In some instances, several motion-powered machines may be tethered to the same anchor, thus reducing the number of anchors required. In some instances, motion-powered machines may use the ship as an anchor point. In some instances, several motion-powered machines may be connected together into a group with a single connection with the main ship.

Some configurations of motion-powered machines may be well-suited for surviving storms or other extreme situations. Certain configurations may be best suited for surviving natural or man-made disasters such as tsunamis or wars. For instance, motion-powered machines which are more submerged than are others may have a higher survival rate when exposed to large waves by "diving" beneath wave crests that might otherwise overstress the motion-powered machines. Installations where each motion-powered machine is connected directly to the platform 102 may reduce the effect of a single set of connections being cut; for instance, if a single motion-powered machine were to be lost, the others may not be affected.

Motion-powered machines may be used in configurations which accommodate other shipping traffic in the area, such as fishing boats, recreational vessels, shipping vessels, etc. Such traffic may be unduly affected by encounters with the array, such as fishing nets tangled with the tethers. Various signaling mechanisms, such as strobing lights, flags, and horns may be used to alert other ships of the existence and location of a particular field of devices.

Some configurations may involve the use of a grid in which each motion-powered machine is connected to multiple other motion-powered machines or the ship in a manner that provides for redundancy in the event a link goes down, e.g. due to failure or maintenance requirements. Such grid connections may occur in the moorings and also in the electrical cables.

Some configurations may be useful for quick deployment, such as towing a string of motion-powered machines that are already attached to the ship and only need to have their anchors attached. Prearranged mooring fields may also be prepared, so that quick connections may be made when the motion-powered machines arrive on-site. Such mooring fields may be prepared while a group of machines is being manufactured and hauled to a site. In addition, the mooring fields may be moved, such as when demand for computing or telecommunications power moves, when sea conditions change (e.g., seasonally) or when a time period for legal occupation of an area expires.

In some implementations, a smaller vessel may be based on the platform 102 which may be used for tending the motion-powered machines. It may perform activities such as site setup, maintenance, or other necessary activities that may require direct interaction with the motion-powered machines. The vessel may include, for example, a smaller boat, e.g., 20-30 feet.

Motion-powered machines of various sizes may be used. In some implementations, large motion-powered machines 106 may be used for electrical generation, whereas small motion-powered machines 110 depicted closer to the boat may be used to pump cooling water to a data center. The generating capacity of a motion-powered machine may be increased by increasing the number of pontoons in a given motion-powered machine.

Configurations may involve motion-powered machines of different sizes. For example, different sized motion-powered machines may be available in the future. In some instances, the motion-powered machines may collect power for performing different functions. For example, some motion-powered machines may be used for generating electricity and other motion-powered machines may be used for pumping water. In some implementations, pumping may be performed by direct mechanical coupling, with pumps located in the motion-powered machines 106, 110. In other implementations, dedicated motion-powered machines generate electricity that is used solely for powering electric pumps.

The platform 102 can be anchored with the motion-powered machines, and/or can carry the machines into location. For example, the motion-powered machines 106, 110 may be carried aboard or behind the platform or aboard or behind another platform 102 for long distance travel. Upon reaching the destination, the platform 102 may unload the motion-powered machines 106, 110 and set up the array. Equipment, such as a tender or other equipment, may be present on board the platform 102 for unloading and setting up the motion-powered machines 106, 110. The platform 102 may alternatively unload the motion-powered machines 106, 110 in a nearby port, and the assembled motion-powered machines 106, 110 may be towed by the platform 102 or another vessel to their intended destination.

System 100 may provide for one or more various advantages. For example, much of the world's population lives near oceans, so system 100 could bring computing or telecommunication power close to them. Much of the world's communications infrastructure also runs through the oceans, so that system 100 could tap into existing infrastructure near shorelines. In addition, system 100 may be quickly deployed so as to be inserted in areas requiring quick computing or telecommunication power, such as areas of military conflict or disaster areas.

The data centers 104 may be employed with the computers inside standard shipping containers to make them more portable (e.g., capable of being hauled to the boat or by a truck). The data centers 104 may be constructed modularly in areas having low costs, and may be transported to locations needing communications support relatively quickly. The data centers 104 may be offloaded to areas where a more permanent presence is needed, and may also be connected to the motion-powered machines 106, 110 after such offloading, freeing the ship to deploy to another area. Also, data centers 104, when in the form of shipping containers, may be quickly traded out when technology changes. Modularization also makes maintenance simpler; hardware that is corroded or worn out from the harsh salt water environment can be easily replaced with fresh hardware by swapping containers.

Use of modules may also provide convenient access to subsystems. Modules may simply be moved to access support structures undergoing maintenance, such as cooling or electrical systems. The modules may be repositioned on the ship temporarily for repairs, or installed in a new location to facilitate continued operation.

The platform 102 may have amenities that support system operations. For instance, the platform 102 may include living accommodations for crew and operating staff. A helipad may also be provided to facilitate access for personnel and quick turn-around for activities such as replacing parts or for setting up new equipment. The platform 102 may, in addition, be able to accommodate a ship tender capable of re-supplying the platform 102 with items such as consumable supplies such as fuel oil and perishables for the crew, parts for maintenance, etc. In addition, out-board fuel tanks may be provided and connected to platform 102 when additional fuel supplies are needed.

The system 100 may include modules with an integral backup power supply and cooling system in the event the primary systems are unavailable. The backup system may be capable of using an alternate source of energy, such as a fuel-based power generation system. In some implementations, the system 100 may be able to store energy to form a reserve that can be drawn upon during periods with low wave activity. As one example, banks of batteries may be used to store electrical energy. As another example, fuel cells may be used with hydrogen kept in a reservoir, which is filled by electrolysis when wave energy is available. Solar power may be used to supplement power collected from the motion-powered machines; calm days where little wave energy may be available may also be cloudless, maximizing solar energy that is available. The system 100 may be implemented using existing equipment with some modifications. For example, a ship capable of hauling intermodal freight containers may be outfitted with electrical and cooling systems to support the functionality described above.

Electrical and pumping power may also come from devices powered directly by the wind. For example, wind turbines may be mounted or tethered to an ocean floor and may be provided to receive prevailing winds for power. Such power may be provided instead of, or in supplementation to, water-powered systems. A datacenter may be placed near such wind turbines, which may themselves be arranged in a line or grid arrangement, and be tied electrically to them. In one implementation, power from an array of wind turbines may be provided to a single point connection, and a data center may connect to the power there.

One or more wind turbines may be provided with mechanical linkages that permit them to also pump cooling water to a data center. Such turbines may be dedicated only to pumping, or may provide both electrical generation and pumping. Where pumping is provided, the data center would typically be near the turbine to minimize the length of piping required. In certain implementations, the data center or part of the data center may be attached directly to the turbine, including by being located in the upper head of the turbine that rotates with the turbine blades. In such situations, airflow and turbulence from the blades may be used to help cool the data center.

In addition, cooling may be supplemented by other mechanisms that draw little electricity, such as absorption chillers. Such chillers may be provided on platform 102, and may be used during periods in which the data center needs to operate and be cooled, but naturally-generated electricity and cooling is insufficient to provide the needed cooling for the data center. In addition, such cooling may be used when pumping power is adequate, but sea water is not sufficiently cool to provide needed levels of cooling.

Where absorption chillers are employed, valving on pipes leading to heat exchangers may be provided to shift one or more heat exchangers from sea-water cooling to chiller cooling. For example, an open loop may exist on a heat exchanger by which sea water flows through one side of the exchanger, and cooling water that enters and leaves the data center flows through the other side. A side branch for the data center cooling water may extend to a heat exchanger whose second side is connected to an absorption chiller. When additional cooling is needed, the data center cooling water may be redirected in whole or in part from the first heat exchanger to the second. Additional heat exchangers may also be employed, so that changes from sea water cooling to chilled water cooling may be made gradually.

Figure 1B:
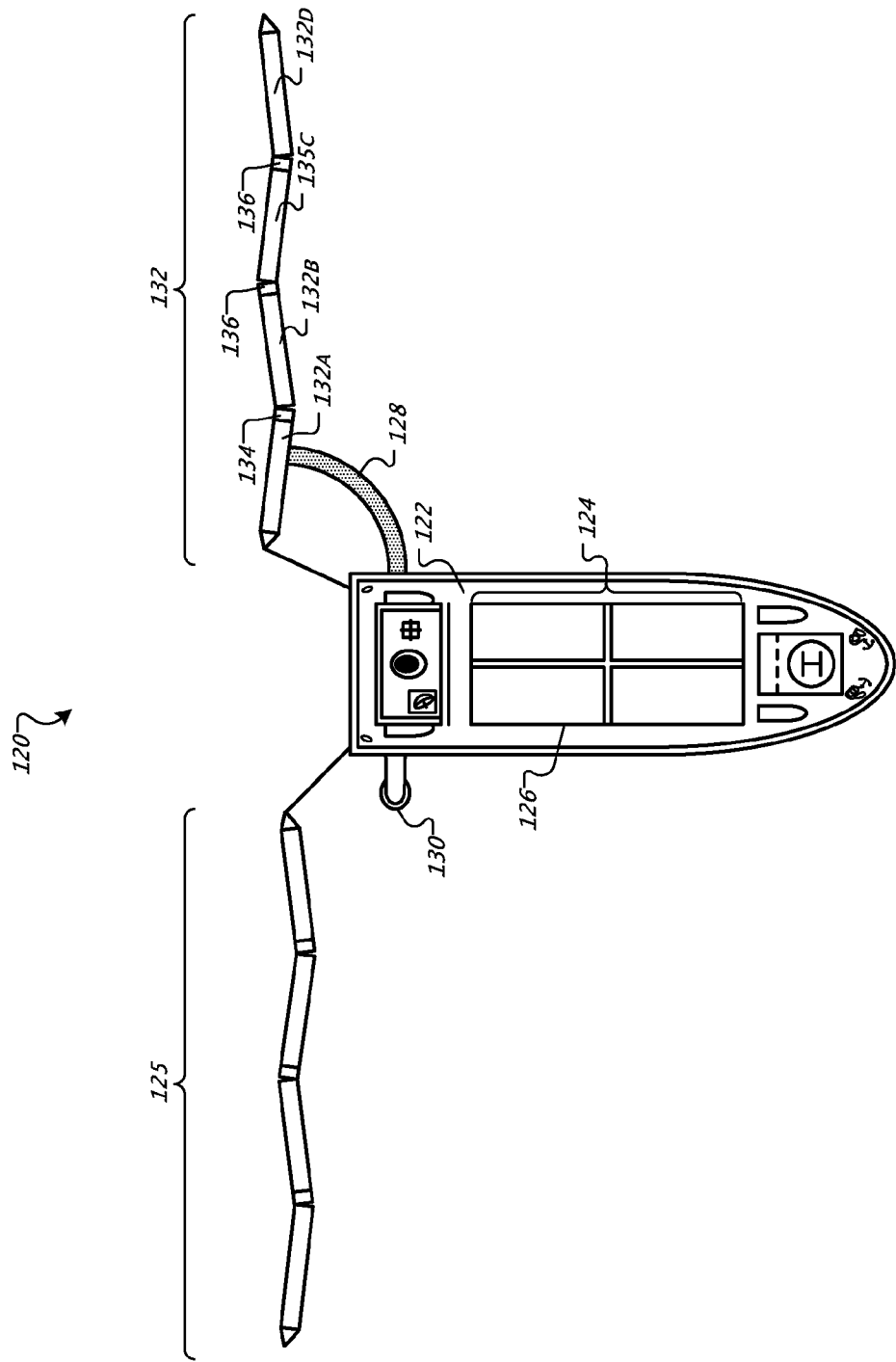
FIG. 1b is a top view of a floating data center system using a pair of motion-powered machines.

FIG. 1B is a top view of a floating data center system 120 using a pair of motion-powered machines. In general, the floating data center system 120 has a floating platform 122 carrying a modular data center 124. Motion-powered machines 125,132 may provide power and cooling capacity to floating platform 122. The floating platform 122 may direct power and cooling capacity supplied by the motion-powered machines to the modular data center 124. As a result, the floating data center system 120 may be able to operate without external connections for providing power or cooling.

The floating platform 122 may, for example, include a seagoing ship such as a freighter. The modular data center 124 may make use of shipping containers 126, such as standardized intermodal freight containers, to hold the data center's equipment. The shipping containers 126 may be loaded and unloaded using conventional port equipment. In the event that one or more modules 126 of the data center 124 needs to be replaced, the floating data center system 120 may simply pull into a port and have the appropriate modules swapped out and replaced with new ones.

The motion-powered machines 125,132 may extend laterally from the floating platform 122, for example, with one end connected to the rear of the floating platform and the other end anchored to the seabed. The motion-powered machines 125, 132 may gather mechanical power from wave action and apply it to a purpose such as pumping fluids or generating electricity. The relative positioning of the floating platform 122 and the motion-powered machines 125, 132 is shown here only for illustrative purposes; the actual alignment of the components will generally be established so as to provide for maximum energy generation, and for the proper operation of the platform 122 also.

The motion-powered machines 125, 132 may have the ability to convert wave action to electricity and pumping capacity. For example, in some implementations, the motion-powered machine 132 may have a piston-powered pump 134 present in its first pontoon 132A, and electric generators 136 present in its other pontoons 132B, 132C, 132D.

The motion-powered machine may cool the modular data center 124 by pumping coolant. In some cases, the cooling system used in the floating data center system 120 may include an open loop. For example, a conduit 128 may be used to transfer a coolant such as subsurface seawater from a pump 134 located in the first section 132A of the motion-powered machine 132, to the floating platform 122. In some instances, the motion-powered machine 125 may provide electrical power to drive a pump (not shown) onboard the floating platform 122; the pump may draw in cool seawater through an intake pipe 130 that is used to cool the modular data center 124. An intake pipe which extends below the surface of the water may draw up cooler water than water that is present at the surface, due to the differences in density between warm and cool water, and due to solar heating of the surface water. Seawater that is pumped into the floating data center 122 may be expelled overboard or underwater as the need arises after it has absorbed heat from the modular data center. Various mechanisms may also be employed to ensure adequate dispersion of the water.

In some instances, the cooling system used in the floating data center system 120 may include a closed loop. For example, a coolant, such as fresh water or ethylene glycol, may circulate between the motion-powered machine 125, where it is cooled, and the modular data center 124, where it absorbs excess heat from computing equipment. The conduit 128 may be segregated into separate channels which carry warm and cool coolant. The coolant may be carried to a heat exchanger located in the first pontoon 132A of the motion-powered machine 132. The heat may pass from the coolant on one side of the heat exchanger to seawater on the other side of the heat exchanger, thus cooling the coolant before it is pumped back to the floating data center.

In other implementations, a data center may be located on shore, close to a body of water. Power (whether electrical or mechanical) for the data center may be derived from water-based devices such as Pelamis machines of water-based wind generators. The power may then be transmitted to the data center on shore. Cooling water may also be pumped from the body of water to the on-shore data center.

Figure 1C:
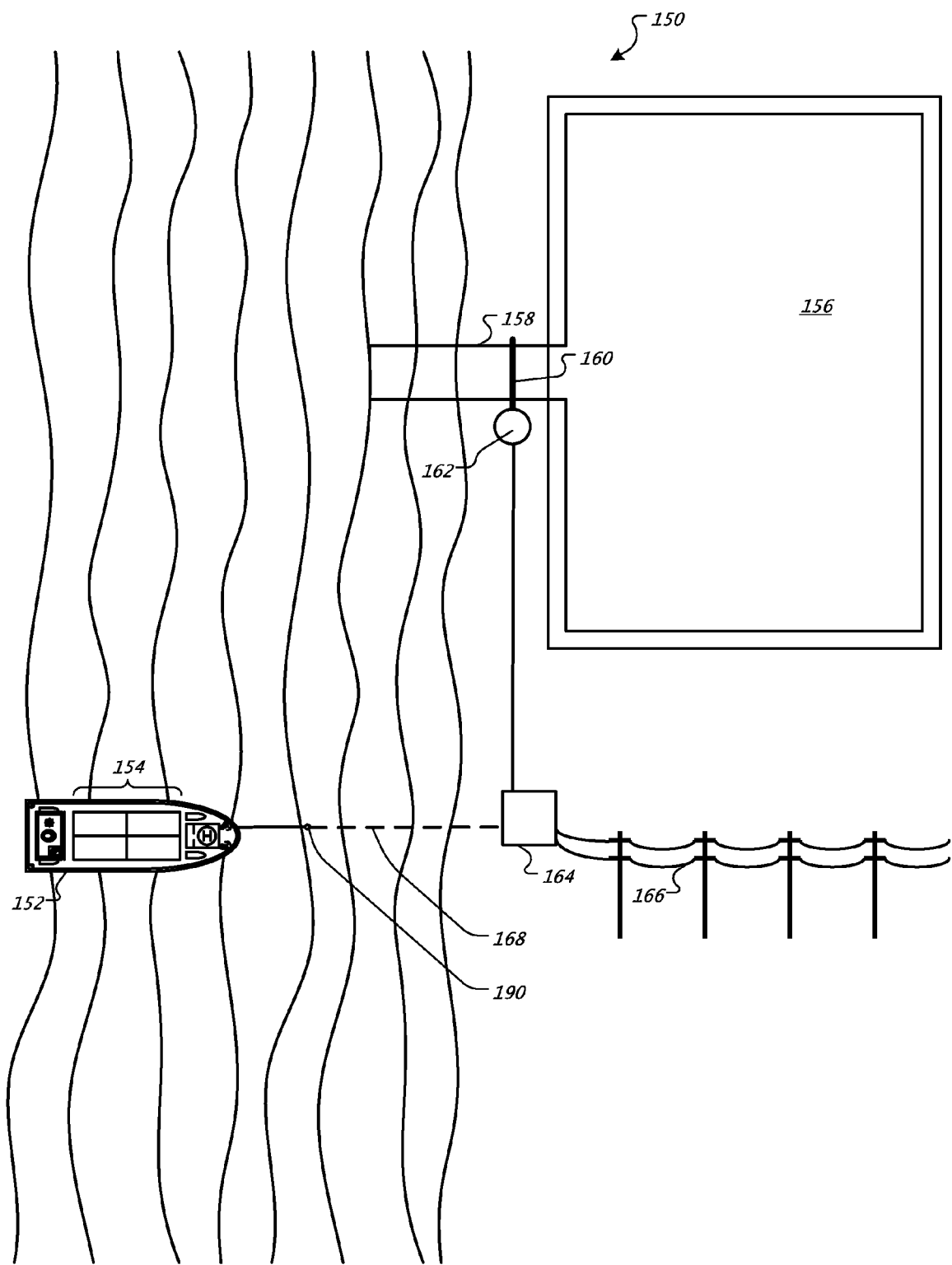
FIG. 1c is a top view of a floating data center system powered by a tidal power system.

FIG. 1C is a top view of a floating data center system 150 powered by a tidal power system. In general, the tidal power system converts energy gathered from rising and falling tides into electricity. The electricity is passed to the floating data center system 150 where it is used to power and cool computing equipment.

In the figure, a floating data center system 150 includes a floating platform 152 carrying a modular data center 154. The modular data center 154 may consist of one or more modules on the floating platform. The modules may be, for example, intermodal freight containers. The modules may contain computers and other equipment necessary for data center operations. Such equipment may include computing equipment such as racks of servers or hard drive arrays. The modules may also include communications equipment such as wireless base stations, modems, or any other related equipment. Alternatively, the modules may contain almost exclusive telecommunications equipment, such as switches, routers, and other structures.

A tidal basin 156 provides electrical power to the floating platform 152. A channel 158 connects the basin 156 to the ocean, and a gate 160 controls the flow of water into and out of the basic 156. A water-powered generator 162 gathers energy from water flowing in and out of the tidal basin 156. In operation, the gate 160 may be held open when the tide is rising so that water fills the basin 156. When the tide peaks, the gate may be closed. When the tide falls, water may be routed from the higher level in the basin 156 through turbines in the water-powered generator, similar in operation to how a dam operates. The gate 160 may also be closed as the tide rises, and higher ocean water may fall through turbines to create power. The gate 160 may thus be operated simply to ensure that the difference in the water height between the basin 156 and the ocean is sufficient to power the generator 162. The energy collected by the tidal power system may be used to provide electrical power and cooling capacity to the modular data center 154. As a result, the modular data center 154 may be able to operate using energy gathered from the motion of seawater.

The electricity may be carried to a junction or switching box 164. The switching box 164 may pass the electricity to the floating platform 152. When electricity is not available from the tidal basin, such as when the water level inside and outside the tidal basin is (nearly) equal, electricity may be provided from an external source, such a continental power grid 166. At other times, such as when the modular data center 154 is not at full usage, excess power generated from the tidal basin 156 may be delivered to the power grid 166. Also, a portion of the power for modular data center 154 may be drawn from generator 162 and a portion from the grid 166.

Electricity may be passed partway to the floating platform from the switching box via a buried cable 168. Burying the cable 168 may inhibit damage to it from wave action or beach traffic. At a point 190 away from shore, the cable emerges into the water and is connected to the floating platform 152, thus supplying it with electricity. In some instances, the cable 168, or a separate cable, may be used to provide communications between the floating platform and other systems located on shore. The communications cable may include, for example, one or more optical fiber bundles, and may be connected via junction or switching box 164 (which may include both power and data switching components) to an on-shore data network. In some cases, a wireless transceiver on the floating platform may be used for such communication.

Figure 2:
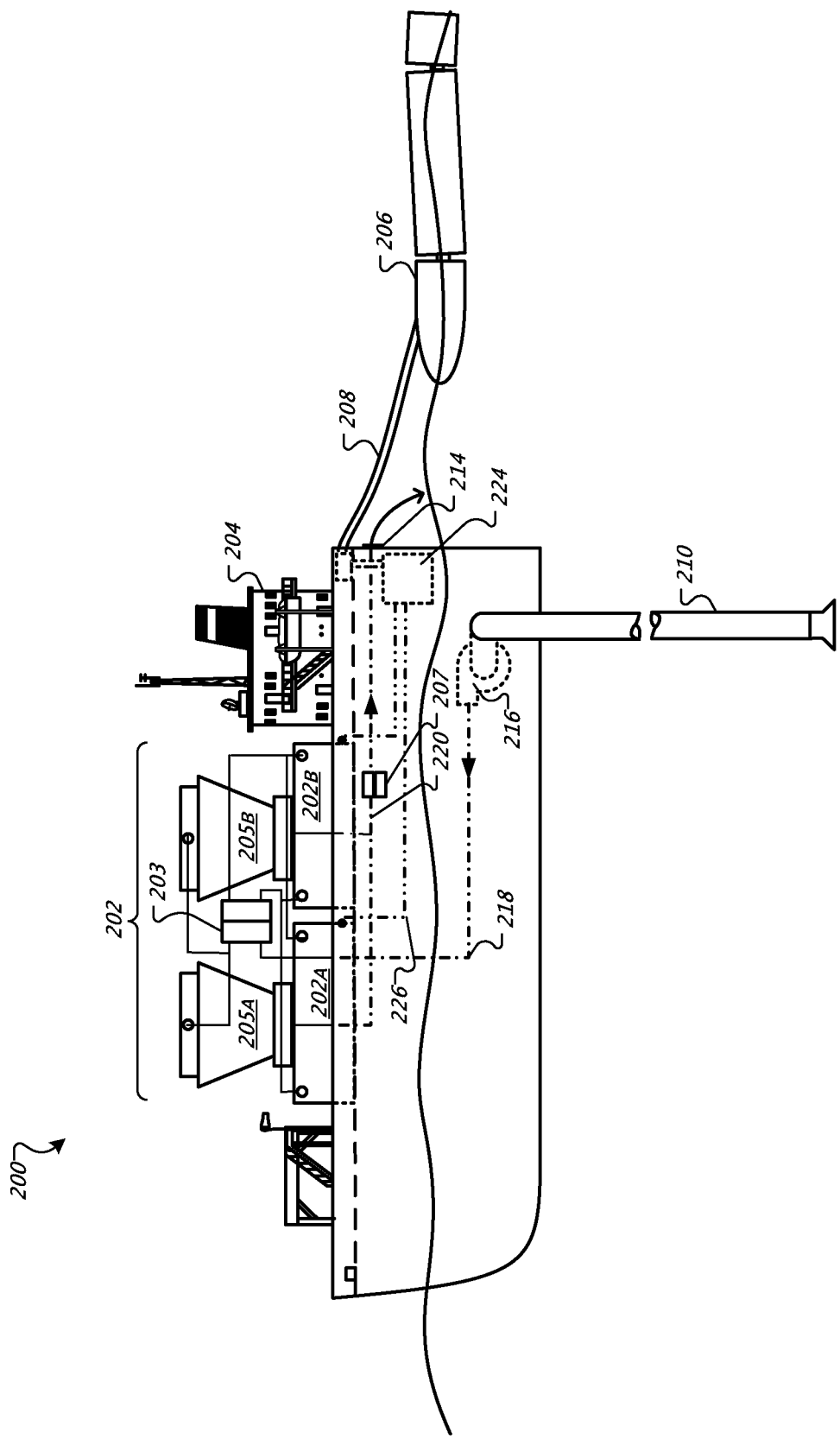
FIG. 2 is a side view of a floating data center system.

FIG. 2 is a side view of a floating data center system 200. In general, the system 200 has a modular data center 202 aboard a floating platform 204, connected to one or more motion-powered machines 206. The modular data center 202 can be made up of computer equipment in one or more modules. The motion-powered machines 206 may provide power and cooling capacity to the modular data center 202. As a result, the modular data center 202 may function without connecting to external utilities.

Referring more specifically to the figure, a modular data center 202 of a floating data center system 200 has modules 202A, 202B aboard a floating platform 204. The modules 202A, 202B may be in a standardized format, such as an intermodal freight container, such as those used in the transportation industry. The modules 202A, 202B may have computing resources such as racks of servers, telecom equipment, etc., installed in them.

In some instances, the floating platform 204 may be a ship, such as a freight hauler, outfitted to handle the modular data center 202. The floating platform 204 provides a structure to physically support the modular data center 202 as well as utilities such as electricity and cooling capacity. The floating data center 204 may be connected to an external power generating device such as a motion-powered machine 206. The motion-powered machine 206 may in turn harness wave energy to provide resources such as power or cooling capacity to the modular data center 202. The modular data center 202 may use power supplied to the floating platform 204 by the motion-powered machines 206. The connection between the floating platform 204 and the motion-powered machine 206 may be in the form of a cable 208, for example, when electricity is being supplied. If cooling capacity is being supplied, other appropriate connectors, such as a flexible tube may also be used.

Power may be supplied to the floating platform 204 using standard techniques for transferring marine power. Electricity may be generated by the motion-powered machine 206 at an appropriate voltage and passed through the cable 208 to the floating platform 204. For example, a high-voltage AC electrical system may be used with a step-up transformer located in the motion-powered machine 206 and a step-down transformer located in the floating platform 204.

The electricity may be passed through a power converter 224 and be distributed to various systems, such as a pump 216 or data center modules 202A, 202B. Power lines 220 within the ship 204 may distribute electricity to the modular data centers 202A, 202B. In some instances, the power converter 224 may output several different voltages. For example, it may output 120V AC 60 Hz for electronics designed for the North American power grid and 240V AC 50 Hz for electronics designed for European power grids. DC power may also or alternatively be provided, for example, for certain server racks that do not use switching power supplies.

Cool water is denser than warm water, causing water below the surface to be cooler than water at or near the surface. To take advantage of this, the cool water may be drawn through an inlet tube 210 that extends below the surface. Pump 216 may be used to draw in the cool water and send it through supply pipes 218 for distribution to the modules 202A, 202B.

The cool water may also pass through heat exchangers, such as heat exchanger 203, either at or away from the data center modules. Such use of heat exchangers allows the relatively caustic seawater to be isolated in only one part of the system, with fresh water or other coolant circulating in a closed-loop system on the other side of the heat exchangers. As a result, maintenance may be minimized, as the closed-loop side of the system may be kept in operation, with frequent replacements needed only on the saltwater side of the system.

The heat exchangers may be connected to integrated cooling systems within the modules 202A, 202B that directly cool equipment. The cool water warms up as it absorbs waste heat deposited in the heat exchangers, for instance, by computer equipment. The warm water may pass through return pipes 220 and be expelled, for example, through a port 214 in the rear of the floating platform 204.

In this example, heat exchanger 203 transfers heat between a process cooling water loop that circulates water through the modules 202A, 202B, and a condenser water loop that carries water taken from the open body of water that lies around the floating platform 204, via the inlet tube 210. The process loop in this example is closed, and passes between one side of the heat exchanger 203, which may be a plate heat exchanger or a shell-and-tube heat exchanger, and cooling units (not shown) in each of the modules 202A, 202B, such as water-to-air heat exchangers (e.g., fan coil units) that may be centrally located in the modules 202A, 202B or may be distributed through the modules 202A, 202B, such as at each computer rack inside each of the modules 202A, 202B. The water-to-air heat exchangers may thus be used to cool the air around the computers in the modules 202A, 202B. The process loop thus carries water from the modules 202A, 202B to one side of the heat exchanger 203 and back to the modules 202A, 202B. The condenser loop carries water form the open body of water through the heat exchanger, and as discussed in more detail below, potentially through other components such as cooling towers 205A, 205B.

The condenser water loop may be open, both at the body of water and at the cooling towers 205A, 205B. The water may be received at inlet tube 210 and first circulated through the heat exchanger 203 via supply pipes 218. The entering water may be relatively cool, and may thus transfer some of its heat out of the process water loop in this stage of the process. The warmed water may then be circulated out of the heat exchanger 203 and passed to the water towers 205A, 205B. Such a second stage of the process is optional and may permit cooling via the release of latent heat when some of the water evaporates in the cooling towers. The resulting, cooled condenser water may then be passed through a second heat exchanger 207 and may be returned to the initial body of water via return pipes 220 and port 214. (For purposes of clarity, the process water loop that passes through heat exchanger 207 is not shown. That loop could be run in series with, or in parallel with, the process water loop that passes through heat exchanger 203, and would communicate with cooling units in the modules 202A, 202B.) The second heat exchanger 207 may alternatively be removed from the process, and the evaporation of water in the cooling towers 205A, 205B may be aimed simply at reducing the temperature of the condenser water before it is returned to the surrounding body of water. Depending on the salinity of the water, appropriate mechanisms may be employed to maintain and operate the cooling towers 205A, 205B and other equipment.

When the temperature of the water entering from the open body of water is cool enough, a single stage of heat exchange may be adequate to operate the system. In particular, entering water may be passed through the heat exchanger 203 without subsequently being passed to the cooling towers 205A, 205B. A by-pass valve (not shown) may be provided in such a situation to permit control of the water circulation in response to the incoming condition of the cooling water.

The cooling towers 205A, 205B may be open to the air or may be hybrid towers. Open towers splash water down the height of the towers 205A, 205B and simultaneously blow outside ambient air across the falling water so as to evaporate some of the water and cool the remaining water by removing the heat of evaporation (so that the exiting water approaches the ambient wet bulb temperature of the air). Hybrid towers brings process water into the tower inside a heat exchanger, and route condenser water on the outside of the heat exchanger. (In such a situation, the heat exchanger 207 would be integrated with the towers 205A, 205B.) Generally, the efficiency of a hybrid tower is lower than that of an open tower because its approach temperature is higher.

In one example of the operation of a system like system 200, sub-surface water may be obtained from an open body of water like the ocean or an ocean-connected bay at a temperature between 1 degrees Celsius (in cold climates) and 25 degrees Celsius on the high end. The water may initially be run through heat exchanger 203, which may receive process water in a range of about 16 to 43 degrees Celsius, where the incoming process water is at a higher temperature than the incoming water form the open body of water (e.g., more than 10 degrees Celsius). The water from the open body of water may then exit the heat exchanger 203 at a much higher temperature than it entered (and the process water will exit at a substantially lower temperature than it entered), where the difference between the exiting temperatures can be approximately 1.5 degrees Celsius or more. The water from the open body of water may then be passed through the cooling towers 205A, 205B and may then be brought back down in temperature to approximately the current outdoor ambient wet bulb temperature, and then be brought back up using process water that enters the heat exchanger 207 at the same temperature or a different temperature compared to the water entering heat exchanger 203. This second stage of heat exchange may be limited, by an automated control system, to situations in which the temperature of the incoming cooling water is insufficient for a single stage of cooling to provide adequate capacity.

A chiller or similar powered cooling mechanism may be added as a third stage to the process. Thus, cooling water may be provided to the process water loop from the two stages just describe, and additionally from a chiller when additional cooling is needed. Each of the stages, or any combination of the stages may also be employed. The use of certain stages may be controlled by an automatic control system (e.g., that senses the incoming water temperature and heat loads in the modules 202A, 202B) that operates by-pass valves or similar valving.

The particular cooling configurations shown here, as noted below, can be implemented on floating or land-based platforms. For example, the inlet 210 may be routed from a sub-surface area of a body of water to a land-based mechanical center that supports a land-based data center, via a conduit that may be placed above or below ground. The mechanical center may be in the form of a plant for cooling process water that is routed to the data center. The plant may be provided with one or more water-to-water heat exchangers and one or more cooling towers, where the heat exchangers and cooling towers may be piped and controlled as described above and below. In certain implementations, the open body of water may be a bay that is off of an ocean or other saltwater body of water, and the intake cooling water may have lower salinity than would water from the center of an ocean. Such water may be more usable in a system like that described here, and especially with an evaporative system like an open water tower system.

The floating platform 204 may have integrated control systems for handling power and cooling. For example, the floating platform 204 may have power monitoring equipment that automatically brings on additional sources of power, such as other motion-powered machines or backup generators, as the load demanded by the modular data center 202 increases. An automatic control system, which may be housed with power converter 224 and may be controlled from the deck of the floating platform 204 or other appropriate area (such as by distributed controls in each of the modules 202A, 202B), may be used to adjust cooling capacity to an optimum level that provides sufficient cooling without excessive wear and tear on moving parts. For example, in some implementations, temperature sensors integrated with the supply 218 and return 220 pipes may be used to determine whether the current flow rate is sufficient to keep the modular data center cool. In some implementations, the modules 202A, 202B may have sensing and control systems that are integrated with the floating platform 204 such that they request additional cooling capacity when needed.

Figure 3:
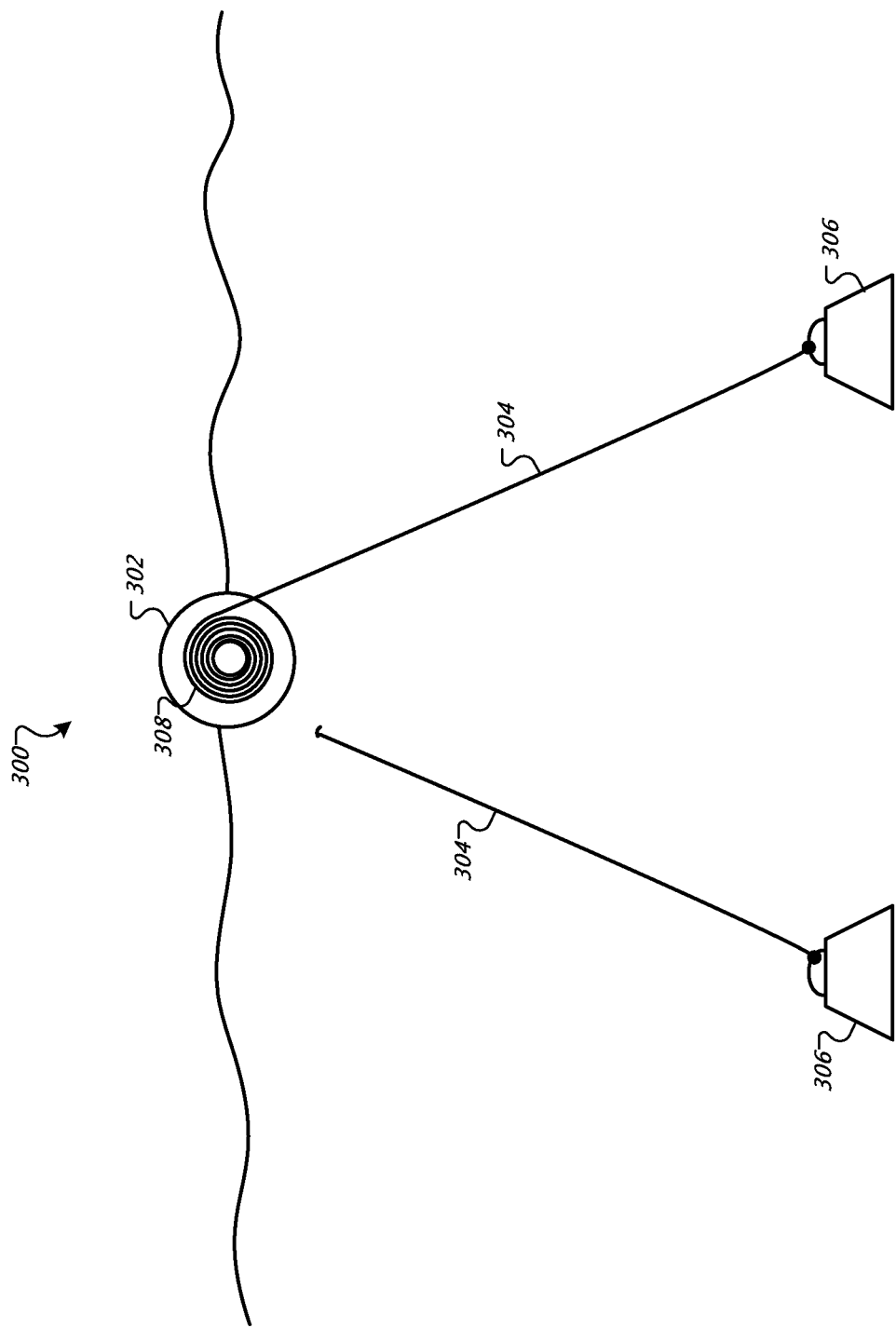
FIG. 3 is a cross-section of a floating power generation apparatus.

FIG. 3 is a cross-section of a floating power-generation apparatus. The illustrated apparatus is different from the Pelamis machines discussed above. In general, a floating body 302 has tethers 304 attached to anchors 306. The tethers 304 may be wrapped around a spring-loaded hub 308 so that the tethers 304 pull out when the waves are high and spring back when the waves are low. The resulting motion may be converted by a generator to electricity, or may be used to operate a mechanical pump for pumping of seawater to a floating platform for cooling.

In more detail, similarly to the motion-powered machines described above, a floating body 302 may be attached with tethers to anchors 306 on a seabed. In this case, however, the tethers 304 may be wrapped around a spring-loaded hub 308, so that the tethers 304 pull out when the waves are high, due to the body's 302 flotation, and springs back when the waves are low. A mechanism, such as a ratchet, may transfer the back-and-forth motion to a shaft. The resulting rotation of the shaft can be transmitted, in some cases, to a electrical generator; electricity produced in such a manner may be transferred, for instance, to a boat for powering computers or other electronic equipment. Such a mechanism may be used as an alternative or additional power generating mechanism to the Pelamis machines described above.

The back-and-forth motion of the tether 304 may also be used to drive a pump used for pumping seawater to a boat for cooling. In some cases, the back and forth motion may be converted to rotary motion for use in driving a rotary pump. In other cases, the back and forth motion may be used to drive a piston pump. In some cases, multiple tethers, springs, or hubs may be used, and dual ratchets may be employed with a stiff tether to permit gathering energy in wave troughs and crests. In some instances, the tethers may be used to transfer electricity or coolant first to the anchor, then to the boat. In other cases, the generator or pump may be co-located with the anchor instead of the floating body 302.

Figure 4:
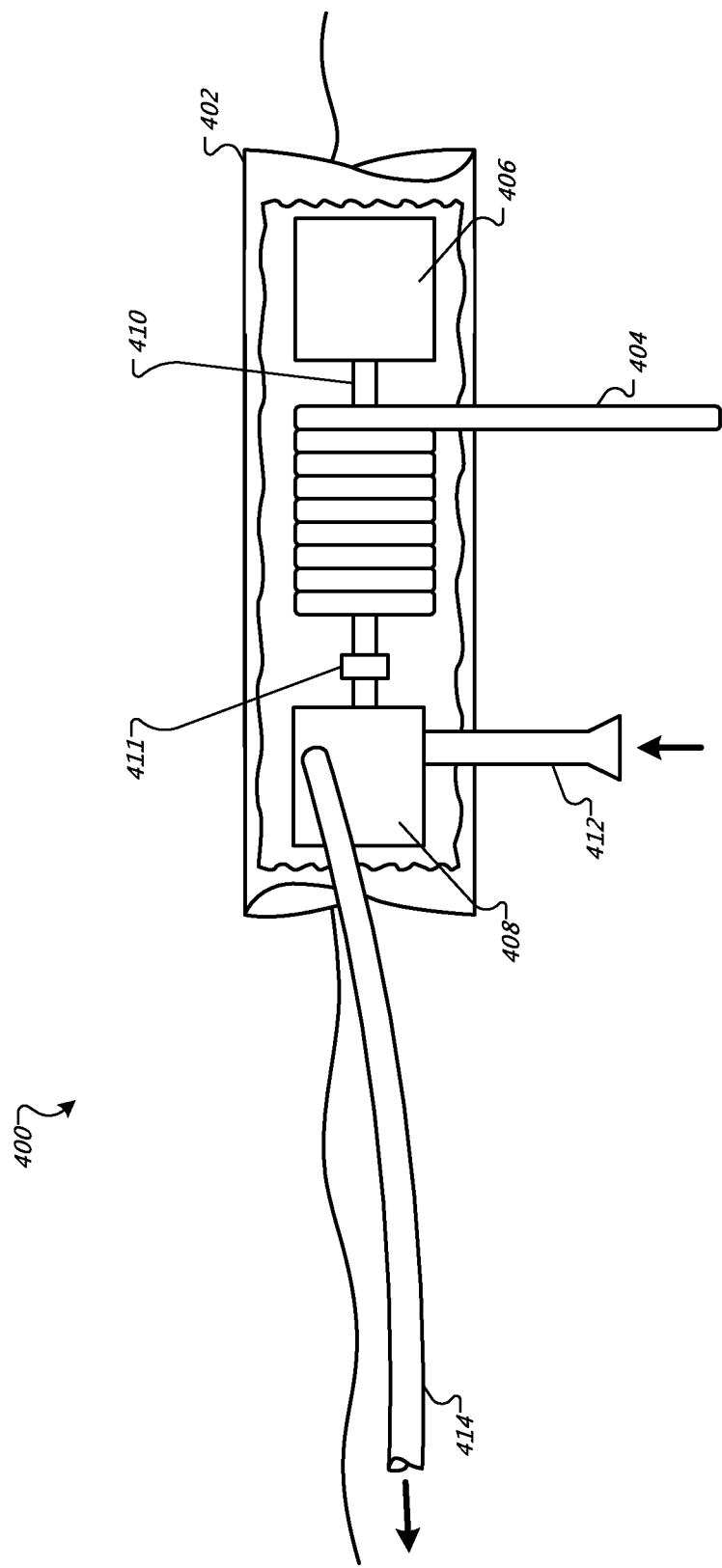
FIG. 4 is a side view of a floating power generation and pumping apparatus.

FIG. 4 is a side view of a floating power generation and pumping apparatus 400, like that depicted in FIG. 3. In general, the apparatus may have a floating body 402, a tether 404, a generator 406, and a pump 408. The tether 404 may be wrapped around a spring-loaded shaft 410 which connects to the generator 406 and pump 408. Motion caused by the coiling and uncoiling of the tether 404 may provide force for rotating the shaft 410 and operating the generator 406 and pump 408.

The apparatus 400 has a floating body 402 with positive buoyancy. The floating body 402 may include, for instance, a sealed steel tube of substantial (e.g., 3.5 meters) diameter and length (e.g., 10-30 meters). An attached tether 404 may anchor the apparatus 400 to the seabed. A generator 406 for generating electricity may be located inside the body 402, and may be connected to the rotating of the tether 404 by a shaft 410. The body 402 may also house a pump 408, such as various forms of rotary pumps. The apparatus 400 may be used, for instance, to provide electrical power and cooling capacity to a floating data center.

The tether 404 may have one end attached to an anchor on the seafloor and the other end wrapped around a spring-loaded shaft 410. As waves strike the apparatus, its buoyancy causes it to move up and down, imparting a spinning motion on the shaft 410. The spinning shaft may cause the pump 408 to pump water and the generator 406 to generate electricity. The pump 410 may suck seawater in through an intake pipe 412 and send it through a tube 414 to a nearby boat, for instance, to cool a floating data center. In some implementations, the tether 404 may also include an electrical conductor used for transmitting electricity to a load. For example, electricity may be delivered through the conductor to a nearby ship-based or shore installation.

In some implementations, a transmission 411 may be used to control rotation of the pump 408 and/or generator 406. Such control may permit an operator to decrease or increase the amount of water flow, and to thereby match water flow to the cooling needs of the system, and/or to allocate the power between the pump 408 and generator 406. In some implementations, the transmission 411 may be controlled electronically, as it may be desirable to remotely control the transmission of the apparatus. In some cases, the transmission may engage the generator, causing it to generate electricity. In other cases, the transmission may engage the pump, causing it to pump water as the shaft is rotated.

Figure 5:
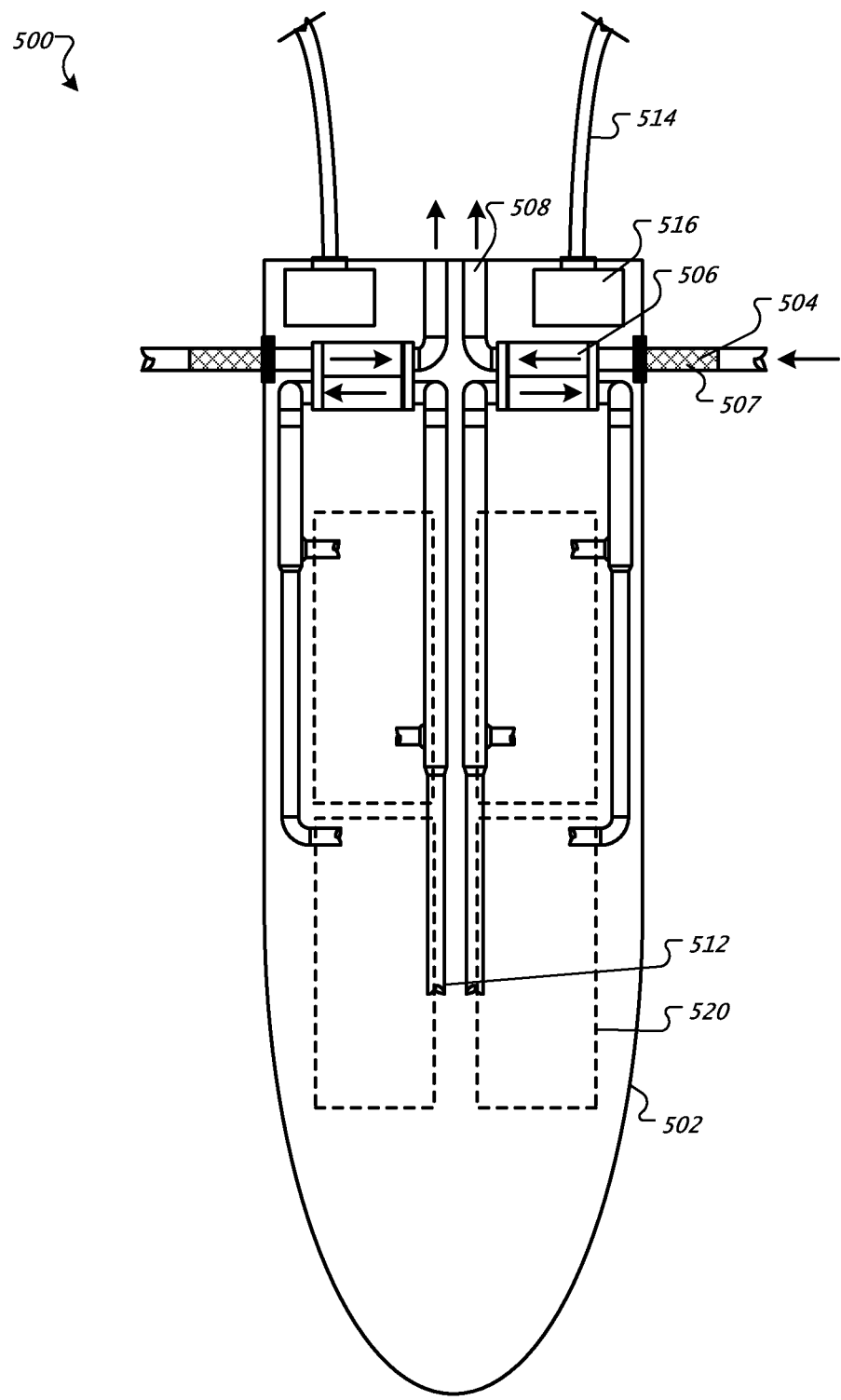
FIG. 5 is a top view of a floating data center system, showing cooling and electrical components.

FIG. 5 is a top view of a floating data center system 500, showing cooling and electrical components. In general, the system 500 shows a below-decks view of various components used to serve an overhead modular data center. The modular data center may be made up of several modules 520 filled with computing equipment cooled by a closed-loop cooling system.

The floating data center system 500 may be carried by a ship 502. Cool seawater may flow into an on-board cooling system via tubes 504 from an external source, such as the motion-powered machines described above or from intakes that open into the sea. Heat exchangers 506 transfer heat from a closed-loop cooling system to the seawater on an open-loop side of the system 500 before it is expelled overboard through ports 508 at the rear of the ship 502. The tubes (or other conduits) may be connected to the ship 502 via flexible connectors 507, which may permit for relative motion between the ship 502 and the tubes 504.

The on-board cooling system may be a closed-loop system that transfers heat using coolant flowing through a network of pipes 512. Use of a closed-loop system allows the use of a coolant less corrosive than the seawater that is ultimately used as a heat sink. The heat exchanger 506 may be exposed to seawater on one side and to the closed loop cooling system on the other. In some cases, the heat exchanger 506 may be of a design, such as a plate heat exchanger, which allows relatively easy replacement of parts subject to failure, such as surfaces exposed to the seawater flowing through them. The portions of the heat exchanger 506 that require replacement may be much smaller and thus may be removed and replaced more easily than the entire system.

Cables 514 may supply electricity to power converters 516 from devices such as motion-powered machines. The power converters 516 convert and condition the supplied power to a suitable form for distribution to data center modules 520 located in the ship 502.

In some implementations, electrical power may be distributed such that modules 520 located in different portions of the ship are powered independently. For example, modules on the port side of the ship may be powered by one set of motion-powered machines and modules on the starboard side of the ship may be powered by another set of motion-powered machines. In such a case, it may be possible to have a limited deployment of motion-powered machines to power a portion of the modular data center. The system may be configured so that power may be transferred from one portion to another. For example, data modules in one portion may experience a peak demand that exceeds the power available form their assigned motion-powered machines; in such a situation, the power supplied to them may supplemented with power provided by motion-powered machines that provide power to other data modules.

Also, the power converters 516 may provide the power in various forms as needed on the ship. For example, as noted above, the power may be provided at various voltages and frequencies of AC power. Also, the power coming in from cables 514, such as AC power at one or more frequencies associate with generators on water-powered machines, may simply be broken down to DC power at one or more voltages for powering the data centers and other components on the ship.

Figure 6:
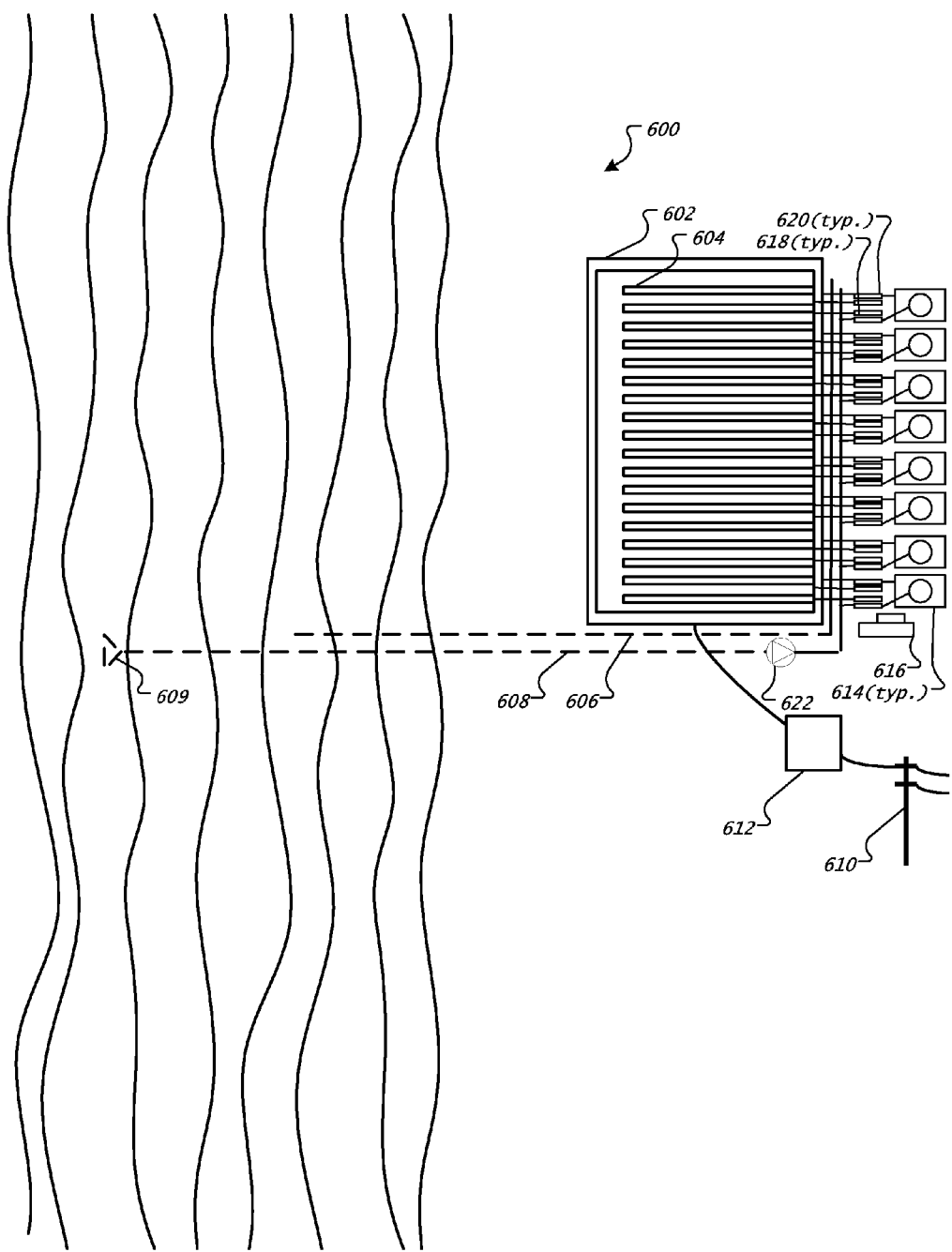
FIG. 6 is a top view of a data center that uses cooling water from an open body of water such as an ocean or ocean extension.

FIG. 6 is a top view of a data center 602 that uses cooling water from an open natural body of water such as an ocean or ocean extension. In the figure, a system 600 is shown that draws cooling water from the open natural body of water and uses the water for cooling purposes in order to cool the computing equipment and other items in the data center 602. The cooling may include conduction through heat exchangers and also evaporative cooling, which may occur, for example, via structures such as cooling towers.

As shown in the figure, a data center 602 is located near a large, open natural body of water, like the oceans and lakes discussed above. An ocean may include extensions to the ocean such as bays or seas that are open to the main area of the ocean. Stepping through the cooling system from the heating loads to the original cooling source, the data center 602 includes a large number of computers installed in rows of computer racks 604, which in this example are shown as being arranged in parallel rows that are separated by aisles where technicians can observe or operate on the computers, such as by removing and replacing defective computers or racks of computers.

The data center 602 may be served by one or more water-to-air heat exchangers (not shown) inside the data center 602, such as in the form of standard cooling coils that are part of fan-coil units, where the coils are located in communication with the inside of the data center 602 so that air warmed by the computers and other components in the data center 602 may be passed through the coils, cooled, and re-circulated back through the main areas of the data center. Water for such coils may be obtained from one or more heat exchangers 620, which may receive warmed water from the coils and may cool the water before returning it to the coils. The circulation of such water in a process water loop may be controlled by one or more pumps and one or more valves (not shown).

The side of the heat exchangers 620 opposite the process water loop may receive cooling water from cooling towers 614 via a condenser water loop. The cooling towers 614 may receive water that is substantially warmer than the current ambient wet bulb temperature and may cool it to a temperature that is near the ambient wet bulb temperature. The cooled water from the cooling towers 614 may be at a lower temperature than is the incoming warmed water from the coils in the data center 602, and the cooling water may thus provide cooling for the water that is circulating from the data center 602.

The cooling towers 614 may in turn receive warmed water from other liquid-to-liquid (e.g., water-to-water) heat exchangers 618 that may take the same form as heat exchangers 620, though they may be differently sized. The heat exchangers 618 may also communicate, on their other sides, with process water circulation loops that pass through the coils in the data center 602. The heat exchangers 618 receive water on their condenser water sides from the open natural body of water, such as the ocean, at a relatively low temperature, and substantially heat it before passing it to the cooling towers 614. The water from the data center 602 circulation loop is thus substantially cooled while passing through the heat exchangers 618 before being returned to the data center 602 to absorb more heat. The process temperatures for the water may be the same as or similar to those discussed above for the system of FIG. 2. Thus, two stages of cooling for the data center process water may be provided, where one stage uses cool water from the open body of water via heat exchangers 618, and another stage uses water that has been cooled by the cooling towers 614 and passed to heat exchangers 620.

The water from the open body of water is supplied by intake conduit or tube 608, and is moved by one or more pumps 612 that may be located in a physical plant adjacent to the data center 602. The intake tube 608 may be located above ground near the physical plant and may drop below the ground as it approaches the open natural body of water. It may then extend out of the ground in the sub-surface area of the body of water at a depth sufficient to avoid interference with boats and other structures on the water surface. The intake tube 608 may have an enlarged opening 609 at its terminus, so that the velocity of water entering the intake tube may be reduced compared to its velocity as it passes through the main portion of intake tube 608. The inlet tube 608 may have its open end at a depth below the water surface that is sufficient to provide inlet water at a relatively constant year-round temperature. The inlet may also be shaped to have multiple inlets that combine into a single pipe, and may be arranged to avoid drawing water, or items in the water, from the surface area.

Another tube, in the form of a return tube 606, may carry water back to the open natural body of water. The return tube 606 may return the water after its has been circulated through the heat exchangers 618, 620 and the cooling towers 614. The return water may be substantially less in volume than the water that enters the intake tube 608, because a portion of the water will have evaporated at the cooling towers 614, in the situation where cooling towers are used.

The system 600 may be provided with cleaning and flushing systems directed toward removing salt and other build-up from the components shown here. Where the body of water is fresh water or an extension of a main ocean so that the water salinity is lower than that of the overall ocean, the cleaning systems may not need to be as robust or used as often as they would with full salt water.

The data center 602 may also be provided with electrical power as an additional utility. In this example, the electrical power arrives via power line 610 connected to sub-station 612, which may be a sub-station dedicated to serving the data center 602 itself. The sub-station may physically be part of the same plant that houses pumps 622 and related valving and equipment. Alternatively, or in addition, the electrical power may be provided from mechanisms that receive power from motion of fluids in nature, such as tidal or wave power devices, or wind generators, which may be installed on land or in the body of water. Such natural generating structure may produce alternating current power at a particular frequency or frequencies, and the power may be rectified to direct current power, reduced in voltage, and sent directly to the computers and other structures in the data center without rebuilding the power to a standard alternating current form that would match the form of power on the electrical grid.

As an example in which water is followed as it enters the system 600, relatively cool water enters in a sub-surface area (e.g., tens or hundreds of feet below the surface) of the open natural body of water through the enlarged opening 609 and is drawn or pumped through intake tube 608 by pumps 622. The relatively cool water may then be passed to a header that connects to a first side of each of heat exchangers 618, where the water (which is used here as condenser water) is warmed by relatively hot water in a closed loop sub-system coming out of the data center 602. Although not shown in the figure, the circulation loop for the data center water may also include a supply and return header that is parallel to the condenser water headers, so that the various heat exchangers and cooling towers may share the load of the data center cooling, and such components may be shut off from the circulation loop and replaced or repaired without substantially interfering with the operation of any part of the data center 602.

The condenser water from the open natural body of water may then be provided to the top of the cooling towers 614 after it is warmed, and may cascade down through the cooling towers 614 to be cooled to close to the wet bulb temperature of the ambient air around the data center 602. The now-cooler condenser water may then be run back through a second set of heat exchangers 620, where other water from the data center 602 is routed through the other side of such heat exchangers 620. The circulation loops for data center water that circulates through heat exchangers 618 may be joined to, or separate from, the circulation loop for data center water that circulates through heat exchangers 620. Such a connection may be changed over time by an operator or automated control system by adjusting valves while the system 600 is running. The circulation loops may be joined, for instance, when the wet blub temperature is close to the temperature of water in the open natural body of water, because the water coming out of the heat exchangers 618 and 620 will be similar for both circulation loops (assuming that the heat exchangers are sized similarly to each other).

The condenser water may then be routed back to the open natural body of water via return tube 606. The evaporation of water in the cooling towers 614 may reduce the volume of water returned to the open body of water, and may thus permit the system 600 to operate at a higher capacity while staying below permissible levels for returning warmed water to the open body of water. Thus, the circulation of water through system 600 may be similar to, and controlled to operate according to the same temperatures, as discussed above for system 200 in FIG. 2.

While the process just described can be termed "free cooling," the system 600 may also be provided with supplemental, powered cooling. For example, one or more chillers such as chiller 612 may be interconnected with the process water loop for cooling the data center 602. (The connections are omitted here for clarity, though appropriate manners in which connections may be made would be well known.) The chiller 612 may be sized to support substantially less than the entire data center 602, and may be employed only when the ambient conditions and the demands of the data center 602 are such that free cooling via the other components is not practical.

In this manner, convenient and relatively inexpensive cooling may be provided to the data center 602, through the provision of ocean or similar water form an open body of water in a first aspect. Additional cooling may alternatively or in addition be provided by further passing the cooling water through one or more cooling towers and then back through another heat exchanger system. The system may be scalable in that additional sets of towers and heat exchangers may be added along a set of headers as demand of the system or the size of the data center 602 increases.

A number of embodiments have been described. Nevertheless, it will be understood that various modifications may be made. For example, although much of the discussion here has centered around wave-powered machines, other power mechanisms, such as wind power (e.g., from sea-based wind generator farms) and river current power may also be used. Also, although several applications of the systems and methods have been described, it should be recognized that numerous other applications are contemplated. Accordingly, other embodiments are within the scope of the following claims.

What is claimed is:

1. A system, comprising:
    a cooling water intake conduit having a water intake positioned in a submerged area between a top surface of an open natural body of water and a terranean surface beneath the body of water;
    a first water-to-water heat exchanger having a first side in fluid communication with the cooling water intake conduit;
    a closed water loop in fluid communication with a second side of the water-to-water heat exchanger and arranged to route water to a cooling structure at a computer data center, the cooling structure fluidly coupled to the first water-to-water heat exchanger and adapted to cool a flow of water, without mechanical refrigeration, from the closed water loop to the cooling structure; and
    a water output port fluidly coupled to the cooling structure and positioned to release water received in the cooling water intake conduit and passed through the water-to-water heat exchanger and the cooling structure to the open natural body of water.

2. The system of claim 1, wherein the cooling water intake conduit descends into the open natural body of water from a platform that is floating on the top surface of the open natural body of water.

3. The system of claim 1, further comprising one or more generators powered by natural movement of a fluid in an open environment and connected so as to power computers in the computer datacenter.

4. The system of claim 3, further comprising one or more rectifiers for producing direct current supply power from power supplied by the one or more electrical generators.

5. The system of claim 4, wherein the one or more rectifiers provide power directly to computers in the data center without further DC-to-AC conversion of the power.

6. The system of claim 1, further comprising one or more pumps to move water from the cooling water intake conduit and through the water-to-water heat exchanger.

7. The system of claim 6, wherein one or more pumps are located in the open natural body of water.

8. The system of claim 1, further comprising one or more cooling towers in fluid communication with the first water-to-water heat exchanger, and arranged to cool water from the cooling water intake conduit that has been heated in the water-to-water heat exchanger.

9. The system of claim 8, further comprising a second water-to-water-heat exchanger in fluid communication with an output of the one or more cooling towers on a first side, and having a second side in fluid communication with a water loop that is arranged to route water to the cooling structure at the computer data center.

10. The system of claim 1, further comprising a supplemental chiller cooling system to provide additional cooling when cooling water from the cooling water intake is insufficient to cool the data center.

11. A method of maintaining a computer data center, comprising:
    drawing in cooling water from a sub-surface area between a top surface of an open natural body of water and a terranean surface beneath the body of water;
    circulating the cooling water through a first side of a first liquid-to-liquid heat exchanger;
    circulating water from a computer data center through a second side of the liquid-to-liquid heat exchanger and to one or more cooling units at the computer data center;
    circulating water from the one or more cooling units at the data center to a cooling structure fluidly coupled to the first water-to-water heat exchanger to cool the water, without mechanical refrigeration, from the one or more cooling units; and
    circulating the cooled water from the cooling structure to a water output port fluidly coupled to the cooling structure to release the cooled water to the open natural body of water.

12. The method of claim 11, wherein the cooling water intake conduit descends into the open natural body of water from a platform that is floating on the top surface of the open natural body of water.

13. The method of claim 11, further comprising generating power for computers in the computer data center from natural movement of a fluid in an open environment.

14. The method of claim 13, wherein the natural movement of the fluid comprises movement of waves in the ocean.

15. The method of claim 11, further comprising rectifying power from the one or more electrical generators and supplying the rectified power to the computer data center.

16. The method of claim 15, providing the rectified power directly to computers in the data center without further DC-to-AC conversion of the power.

17. The method of claim 11, further comprising circulating the cooling water through one or more cooling towers in fluid communication with the first water-to-water heat exchanger, to cool the water.

18. The method of claim 17, further comprising routing the cooling water through a second water-to-water-heat exchanger in fluid communication with an output of the one or more cooling towers on a first side, and circulating water through a second side of the second water-to-water heat exchanger and through cooling units at the data center.

19. A system, comprising:
    a cooling water intake conduit having a water intake positioned in a submerged area between a top surface of an open natural body of water and a terranean surface beneath the body of water;
    a first water-to-water heat exchanger having a first side in fluid communication with the cooling water intake conduit;

a closed water loop in fluid communication with a second side of the first water-to-water heat exchanger and arranged to route water to cooling structures at a computer data center;

a cooling tower that receives water from the first water-to-water heat exchanger and is arranged to provide water cooled by the cooling tower; and a second water-to-water-heat exchanger comprising a first side in fluid communication with the cooling tower to receive the water cooled by the cooling tower, and a second side in fluid communication with the closed water loop arranged to route water to cooling structures at the computer data center.

20. The system of claim 19, further comprising one or more valves operably arranged to route water from the second side of the first water-to-water heat exchanger to the second side of the second water-to-water heat exchanger.

21. The system of claim 19, wherein the first side of the second water-to-water heat exchanger comprises an outlet in fluid communication with the open natural body of water.

22. The system of claim 19, further comprising an automated control system communicably coupled to the one or more valves and operable to:

monitor an outside air temperature and a temperature of the open natural body of water; and based on the outside air temperature and the temperature of the open natural body of water being substantially equal, adjust the one or more valves to fluidly couple the second side of the first water-to-water heat exchanger to the second side of the second water-to-water heat exchanger.

\* \* \* \* \*